US011898378B2

(12) United States Patent
Wang et al.

(10) Patent No.: US 11,898,378 B2
(45) Date of Patent: Feb. 13, 2024

(54) HANDLE MECHANISM AND CASING ASSEMBLY

(71) Applicant: Wistron Corp., New Taipei (TW)

(72) Inventors: Jun-Hao Wang, New Taipei (TW); Qi Liu, New Taipei (TW); Li Ke, New Taipei (TW); Siyun Tan, New Taipei (TW)

(73) Assignee: WISTRON CORP., New Taipei (TW)

( * ) Notice: Subject to any disclaimer, the term of this patent is extended or adjusted under 35 U.S.C. 154(b) by 239 days.

(21) Appl. No.: 16/995,110

(22) Filed: Aug. 17, 2020

(65) Prior Publication Data

US 2021/0355707 A1 Nov. 18, 2021

(30) Foreign Application Priority Data

May 13, 2020 (CN) .......................... 202010402390.0

(51) Int. Cl.
*E05B 7/00* (2006.01)
*H05K 5/02* (2006.01)
(Continued)

(52) U.S. Cl.
CPC ................ *E05B 7/00* (2013.01); *E05B 65/46* (2013.01); *E05C 3/14* (2013.01); *E05C 19/022* (2013.01);
(Continued)

(58) Field of Classification Search
CPC ... E05C 3/00; E05C 3/004; E05C 3/02; E05C 3/04; E05C 3/041; E05C 3/043;
(Continued)

(56) References Cited

U.S. PATENT DOCUMENTS

| 8,444,357 B2 * | 5/2013 | Clarke | F16B 43/00 411/533 |
| 2016/0183395 A1 * | 6/2016 | Butterbaugh | H05K 7/18 361/747 |
| 2016/0183396 A1 * | 6/2016 | Butterbaugh | H05K 7/18 29/428 |

FOREIGN PATENT DOCUMENTS

| DE | 202011005589 U1 * | 9/2011 | ........... E05B 13/002 |
| KR | 200184340 Y1 * | 6/2000 | ............. E05B 59/00 |
| WO | WO-2016018241 A1 * | 2/2016 | ............... E05B 1/00 |

OTHER PUBLICATIONS

Machine translation of KR 200184340 Y1 (Year: 2000).*

* cited by examiner

*Primary Examiner* — Christine M Mills
*Assistant Examiner* — Peter H Watson
(74) *Attorney, Agent, or Firm* — Locke Lord LLP; Tim Tingkang Xia, Esq.

(57) ABSTRACT

The disclosure relates to handle mechanism and casing assembly. The handle mechanism is adapted to be installed on a slidable plate body. The handle mechanism includes handle component, latch component, and releasing component. The handle component has engaged position. The handle component includes first hook portion and first pushing portion. The first hook portion has first contact surface. The latch component is slidably disposed and has second hook portion and first contact portion. The second hook portion has second contact surface configured to contact the first contact surface. The releasing component is pivotably disposed and has pressed portion and second pushing portion. When the handle component is pivoted from the engaged position, the first pushing portion pushes the pressed portion so as to force the second pushing portion (Continued)

to push the first contact portion so that the second contact surface is forced to leave the first contact surface.

12 Claims, 8 Drawing Sheets

(51) Int. Cl.
    *E05C 3/14*          (2006.01)
    *H05K 7/14*         (2006.01)
    *E05B 65/46*       (2017.01)
    *E05C 19/02*       (2006.01)

(52) U.S. Cl.
    CPC ........... *H05K 5/023* (2013.01); *H05K 7/1411* (2013.01); *E05Y 2900/606* (2013.01)

(58) Field of Classification Search
    CPC .......... E05C 3/045; E05C 3/046; E05C 3/047; E05C 3/048; E05C 3/14; E05B 7/00; E05B 1/06; E05B 17/0045; E05B 17/007; E05B 13/00; E05B 13/002; E05B 17/20; E05B 17/2007; E05B 17/203; E05B 17/2038; E05B 15/008; E05B 65/006; E05B 65/02; E05B 65/44; E05B 65/46; E05B 1/00; E05B 15/0086; E05B 57/00; E05B 59/00; Y10T 292/039; Y10T 292/0395; Y10T 292/04; Y10T 292/041; Y10T 292/57; Y10T 292/0934; Y10T 292/0951; Y10T 292/0952; Y10T 292/0953; Y10T 292/0959; Y10T 292/1061; Y10T 292/1083; Y10T 292/1084; Y10T 292/1085; Y10T 292/1092; Y10S 292/11; Y10S 292/30; Y10S 292/56; Y10S 292/57; Y10S 292/63; Y10S 292/73; Y10S 292/49; H05K 5/0217; H05K 5/0221; H05K 5/0226; H05K 5/023; H05K 5/0234; H05K 5/0239; H05K 5/0243; H05K 7/1411; H05K 7/1401; H05K 7/1402; H05K 7/1409
    USPC .................................................. 411/160, 162
    See application file for complete search history.

HANDLE MECHANISM AND CASING ASSEMBLY

CROSS-REFERENCE TO RELATED APPLICATIONS

This non-provisional application claims priority under 35 U.S.C. § 119(a) on Patent Application No(s). 202010402390.0 filed in China on May 13, 2020, the entire contents of which are hereby incorporated by reference.

TECHNICAL FIELD

The disclosure relates to a handle mechanism, more particularly to a handle mechanism having no release button on its appearance.

BACKGROUND

A server can provide and implement various cloud services requested by users from various industries, such as gaming, language processing, finance, medical biology, search engines, e-commerce, social media. In order to effectively and stably support massive computation and storage, a server system is required to contain modules/components as many as possible in a limited internal space. In such a case, a server housing may have many server hosts being arranged in a very compact manner, and each of them is heavy in weight since the server host is requested to accommodate as many functional devices as possible.

For the ease of moving the server host during maintenance, the casing of a typical server host is in a form of a slidable manner and equipped with a handle for users to slide the server host casing. Also, to secure the handle in position when it is closed, a typical handle has a release button thereon, where the release button is connected to a mechanism for fixing the handle to the casing while allowing the user to release the handle by pressing the release button.

However, due to the requirement of operating the release button and the limitation of the location of the mechanism, the release button protrudes from the handle and occupies the lateral side of the casing, making the appearance of the handle incompatible with that of the server casing. And the I/O interface of the casing is required to form a hole for the placement of the release button and thus occupying the layout space on the I/O interface. However, without the release button, the traditional handle will be unable to be fixed in position when it is closed. It should be understood that the above issue does not only happen to servers but also happen to any other smaller casings that are removable from a larger casing.

SUMMARY

One embodiment of the disclosure provides a handle mechanism adapted to be installed on a plate body being slidable. The handle mechanism includes a handle component, a latch component, and a releasing component. The handle component is configured to be pivotably disposed on the plate body and has an engaged position. The handle component includes a first hook portion and a first pushing portion. The first hook portion has a first contact surface. The latch component is configured to be slidably disposed on the plate body and has a second hook portion and a first contact portion. The second hook portion has a second contact surface configured to contact the first contact surface so as to keep the handle component in the engaged position. The releasing component is configured to be pivotably disposed on the plate body and has a pressed portion and a second pushing portion. When the handle component is pivoted in a first pivotal direction from the engaged position, the first pushing portion pushes the pressed portion so as to force the second pushing portion to push the first contact portion so that the second contact surface of the second hook portion is forced to leave the first contact surface of the first hook portion.

Another embodiment of the disclosure provides a casing assembly including a plate body and a handle mechanism. The handle mechanism includes a handle component, a latch component, and a releasing component. The handle component is pivotably disposed on the plate body and has an engaged position. The handle component includes a first hook portion and a first pushing portion. The first hook portion has a first contact surface. The latch component is slidably disposed slidably disposed on the plate body and has a second hook portion and a first contact portion. The second hook portion having a second contact surface configured to contact the first contact surface so as to keep the handle component in the engaged position. The releasing component is pivotably disposed on the plate body and has a pressed portion and a second pushing portion. When the handle component is pivoted in a first pivotal direction from the engaged position, the first pushing portion pushes the pressed portion so as to force the second pushing portion to push the first contact portion so that the second contact surface of the second hook portion is forced to leave the first contact surface of the first hook portion.

According to the handle mechanism and the casing assembly as discussed in the above embodiments of the disclosure, the second contact surface of the latch component can contact the first contact surface of the handle component to keep the handle component in the engaged position, and the handle component can push the releasing component to cause the second contact surface to leave the first contact surface when being pivoted towards the first pivotal direction from the engaged position, thus the handle component can be operated without having any additional button thereon.

As such, the handle mechanism at least features a handle for drawing a plate body and a fixing arrangement for fixing the plate body to a plate part, and this concept can be employed in any other smaller casings having a handle for drawing from a bigger casing. For example, the handle mechanism can be employed in a server system, thus pushing a server host casing into a server housing and keeping the server host in position all can be done by simply pushing the handle component of the handle mechanism, and a further push of the handle component in a specific direction will be able to release itself and to allow the server host casing to be pulled out of the server housing. Comparing to the traditional handles that have a release button thereon, the handle component of the handle mechanism can have a relatively simple appearance and therefore will be easier to have a consistent appearance with the casing that accommodates it and can help to achieve a simple-looking appearance of the whole. In addition, in the case of the traditional handles, the placement of the release button requires the casing for supporting the handle to form hole on the I/O interface, but, in the disclosure, the handle mechanism has no need to form any hole for release button on the I/O interface and therefore will not occupy the layout space on the I/O interface.

BRIEF DESCRIPTION OF THE DRAWINGS

The present disclosure will become better understood from the detailed description given hereinbelow and the accompanying drawings which are given by way of illustration only and thus are not intending to limit the present disclosure and wherein.

DETAILED DESCRIPTION

Figure 1:
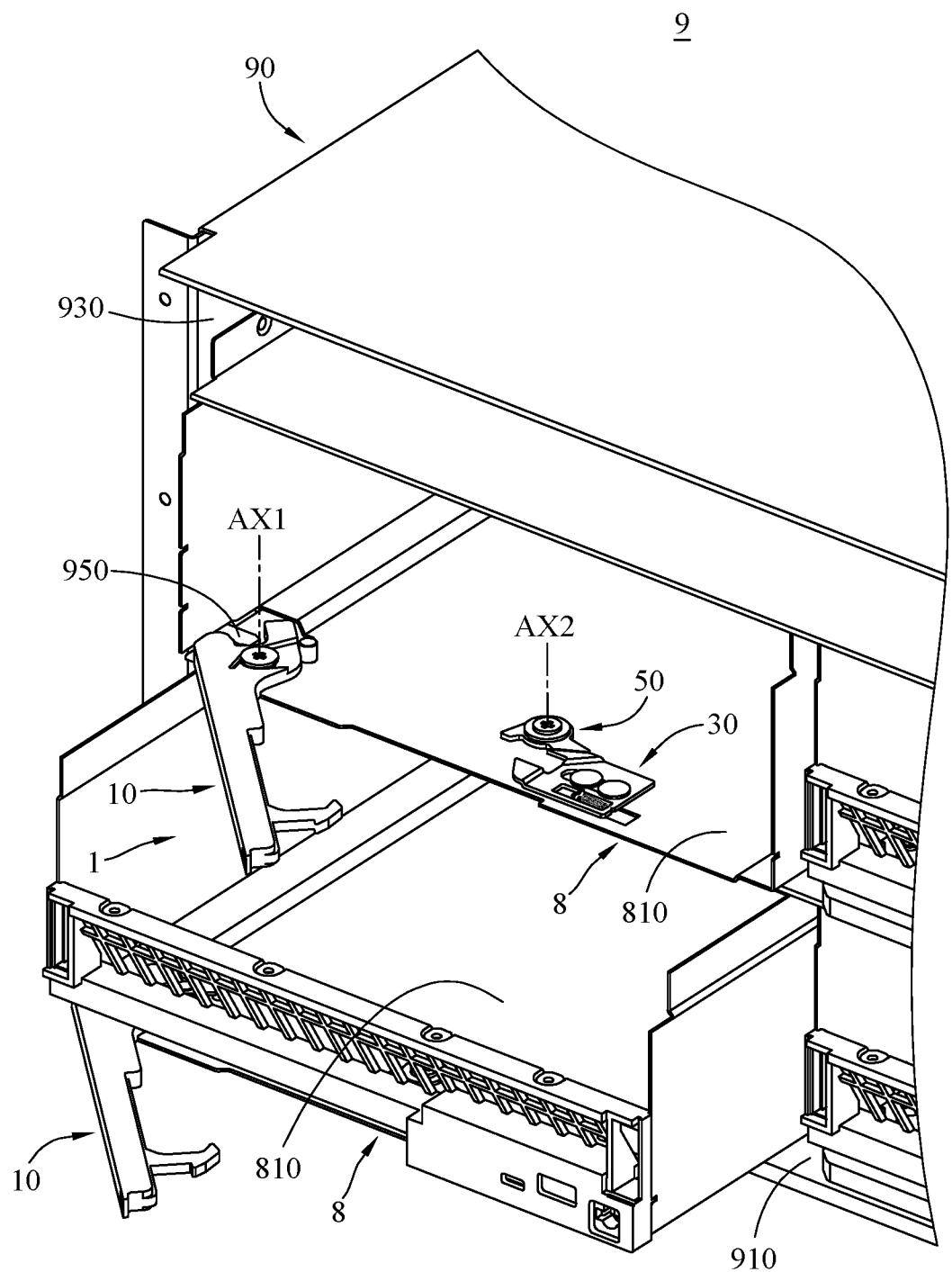
FIG. 1 is a partial perspective view of a casing assembly of a casing containing a handle mechanism according to one embodiment of the disclosure.

In the following detailed description, for purposes of explanation, numerous specific details are set forth in order to provide a thorough understanding of the disclosed embodiments. It will be apparent, however, that one or more embodiments may be practiced without these specific details.

In addition, for the purpose of simple illustration, well-known features may be drawn schematically, and some unnecessary details may be omitted from the drawings. And the size or ratio of the features in the drawings of the present disclosure may be exaggerated for illustrative purposes, but the present disclosure is not limited thereto. Note that the actual size and designs of the product manufactured based on the teaching of the present disclosure may also be properly modified according to any actual requirement.

Further, as used herein, the terms "end", "part", "portion" or "area" may be used to describe a technical feature on or between component(s), but the technical feature is not limited by these terms. In addition, unless otherwise specified, the term "substantially", "approximately" or "about" may be used herein to provide an industry-accepted tolerance to its corresponding term without resulting in a change in the basic algorithm of the subject matter at issue.

Furthermore, unless otherwise defined, all the terms used in the disclosure, including technical and scientific terms, have their ordinary meanings that can be understood by those skilled in the art. Moreover, the definitions of the above terms are to be interpreted as being consistent with the technical fields related to the disclosure. Unless specifically defined, these terms are not to be construed as too idealistic or formal meanings.

Firstly, referring to FIG. 1, one embodiment of the disclosure provides a handle mechanism 1 adapted to be installed on a casing 9. In specific, the handle mechanism 1 may be installed on a plate body 810 of one or more casing assembly 8 removably accommodated in the casing 9, wherein the plate body 810 is slidable with respect to the casing 9, and the handle mechanism 1 is movable with respect to the plate body 810 so as to switch status (e.g., the opened status shown in FIG. 1 or the closed status shown later in FIG. 4C). The casing 9 and the casing assembly 8 are exemplary and not intended to limit the disclosure in any aspect. The casing 9 can be served as a shell or container for electronic or non-electronic devices depending on the filed it is applied, and the casing assembly 8 is a smaller shell or container being accommodated in the casing 9. In one embodiment, the casing 9 may be applied to the field of electronic computing and can be served as the outer casing or housing of a server or personal computer; in this case, the casing assembly 8 may be served as a casing of a server host movably inserted into the casing 9. In one application, the casing 9 may be a 5U server casing, and the casing assembly 8 may be a 2U or 4U server host casing.

In more detail, as shown, the casing 9 may include a casing body 90, the casing body 90 may include at least one plate part 910 and at least one side plate part 930; the plate body 810 of the casing assembly 8 is slidably disposed on and supported by the plate part 910, such that the plate body 810 and the handle mechanism 1 thereon are slidably accommodated in the space (not numbered) formed by the plate part 910 and the side plate parts 930. Note that the plate part 910 may be served as the bottom plate, top plate, or partition plate of the casing 9, and the usage of the plate part 910 is not intended to limit the disclosure in any aspect.

Herein, for simplicity and illustrative purposes and not of limitation, the plate part 910, the side plate part 930, and the casing assembly 8 may be partially illustrated in FIG. 1 or later drawings. In addition, note that the casing body 90 may contain more than one or only one casing assembly 8 and may contain other components required for other purposes but not meant to limit the disclosure.

In addition, as shown, in this embodiment, the casing 9 may further include at least one engagement protrusion 950 disposed on the plate part 910, one end of the handle mechanism 1 is removably engaged with the engagement protrusion 950 so that the plate body 810 of the casing assembly 8 can be fixed onto the casing 9 via the handle mechanism 1, which will be described in greater detail in the later paragraphs.

Figure 2:
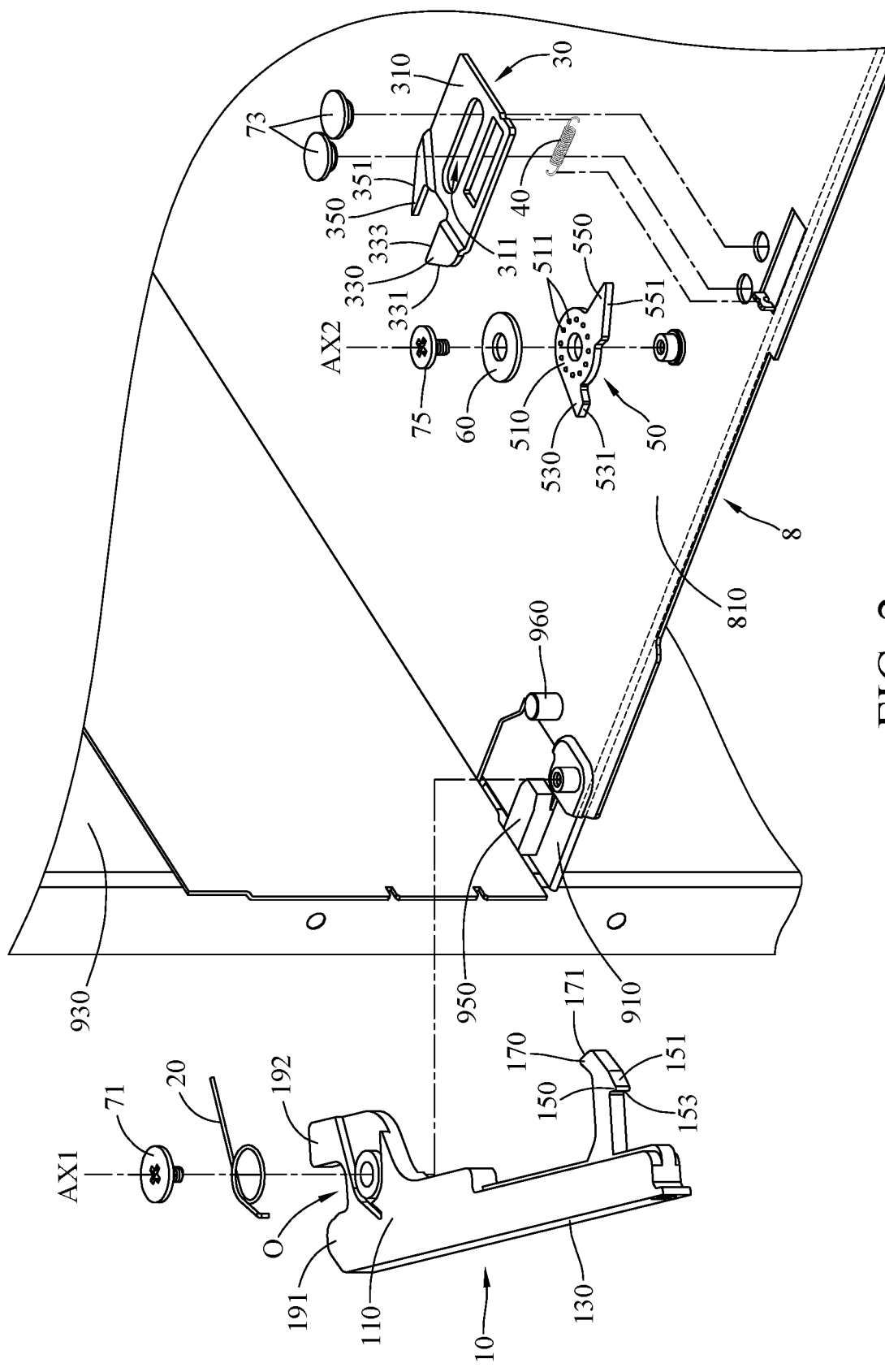
FIG. 2 is an exploded view of the handle mechanism, the casing assembly, and the casing in FIG. 1.
Figure 3:
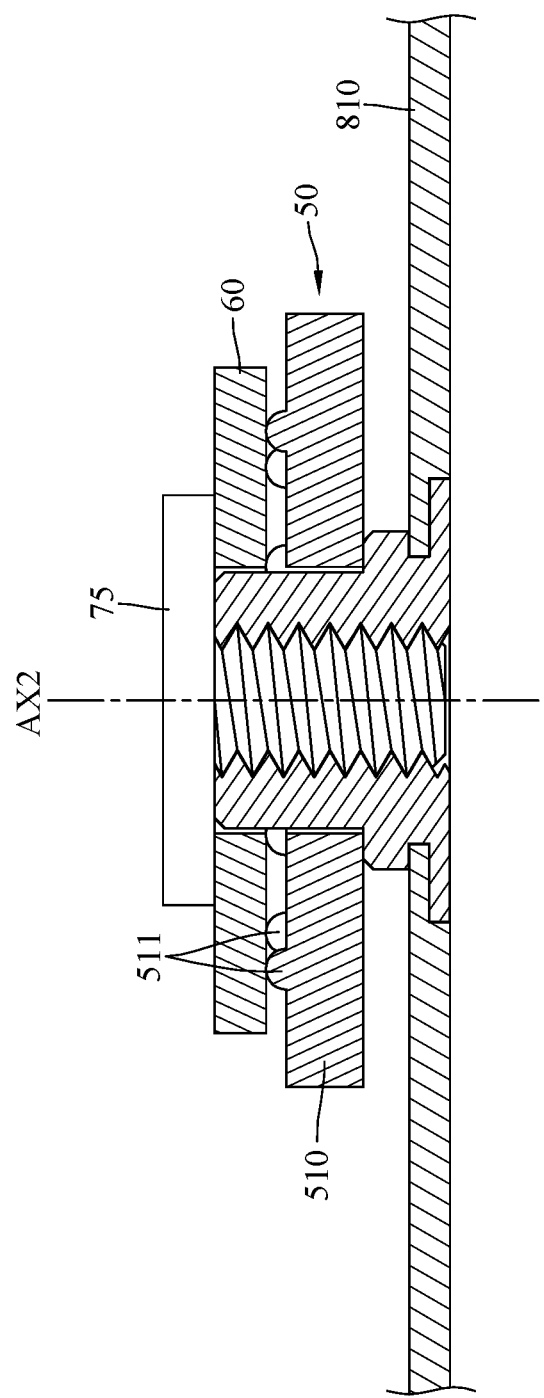
FIG. 3 is a partially enlarged cross-sectional side view of the handle mechanism in FIG. 1.

Herein, please refer to FIGS. 2-3, where FIG. 2 is an exploded view of the handle mechanism 1, the casing assembly 8, and the casing 9, and FIG. 3 is a partially enlarged cross-sectional side view of the handle mechanism 1. In this embodiment, the handle mechanism 1 may include a handle component 10, a latch component 30, and a releasing component 50. In addition, in this embodiment, the handle mechanism 1 may further include a first restoring component 20, a fastener 71, a second restoring component 40, at least one fixing component 73, a washer 60, and a fastener 75.

The handle component 10 may be an integrally formed single piece of any suitable plastic, metal, or the combination thereof. In this embodiment, the handle component 10 may include a pivot portion 110, a handle portion 130, a first hook portion 150, a first pushing portion 170, a contact protrusion 191, and a contact protrusion 192. The pivot portion 110 is pivotably disposed on the plate body 810 via the fastener 71 fixed to the plate body 810, such that the handle component 10 is pivotable with respect to the plate body 810 about an axis AX1 either in a first pivotal direction D1 (as described later with reference to FIG. 4A) or in a second pivotal direction D1' (as described later with reference to FIG. 5B). The first pivotal direction D1 and the second pivotal direction D1' are opposite directions and can also be used for describing movements of other components in the later descriptions. The fastener 71 is, for example, a screw, rivet, bolt, a combination thereof, or other suitable fixing means. In this embodiment, the first restoring component 20 may be disposed between the pivot portion 110 and the fastener 71, the first restoring component 20 may be a torsion spring having two opposite ends respectively pressing against a protrusion 960 of the plate body 810 and the pivot portion 110 so as to constantly force the pivot portion 110 to pivot in the second pivotal direction D1'.

The handle portion 130 extends outward from the pivot portion 110 and is substantially in a straight and handheldable shape for the user to easily operate the handle mechanism 1. The first hook portion 150 and the first pushing portion 170 are both connected to the part of the handle portion 130 relatively away from the pivot portion 110. The first hook portion 150 has a tapered structure tapered towards a direction away from the pivot portion 110, and the first pushing portion 170 has a tapered structure tapered towards a direction towards the pivot portion 110; in other words, the first hook portion 150 and the first pushing portion 170 are two tapered parts of the handle portion 130 substantially tapered towards opposite directions.

In more detail, in this embodiment, the first hook portion 150 may have a first pushing surface 151 and a first contact surface 153, the first pushing surface 151 and the first contact surface 153 are respectively located at two opposite sides of the first hook portion 150, the first pushing surface 151 is substantially facing away from the pivot portion 110 or the handle portion 130 and is inclined with respect to the handle portion 130; and the first contact surface 153 may be a flat surface substantially facing towards the handle portion 130 and parallel to the handle portion 130.

In this embodiment, the first pushing portion 170 of the handle component 10 may have a second pushing surface 171, the second pushing surface 171 is substantially facing away from the handle portion 130 and is also inclined with respect to the handle portion 130. As shown, the second pushing surface 171 and the first pushing surface 151 of the first hook portion 150 are two inclined surfaces facing towards different directions.

In this embodiment, the contact protrusion 191 and the contact protrusion 192 are spaced apart from each other and protrude outwards from the side of the pivot portion 110 opposite to the handle portion 130, as shown, there is an engaging portion O formed between the contact protrusion 191 and the contact protrusion 192 and configured to be engaged with the engagement protrusion 950 on the plate part 910 of the casing 9. When the engagement protrusion 950 is located at the engaging portion O, the contact protrusion 191 and the contact protrusion 192 are respectively located at two opposite sides of the engagement protrusion 950.

In this embodiment, the handle component 10 can be pivoted to an engaged position (as described later with reference to FIG. 4C) in the first pivotal direction D1 or pivoted to a released position (as shown in FIG. 1 or as described later with reference to FIG. 5B) in the second pivotal direction D1' by, for example, the elastic force of the first restoring component 20 or manual force. During the movement of the handle component 10, the first hook portion 150 and the first pushing portion 170 are moved towards or away from the plate body 810 of the casing assembly 8, and the contact protrusion 192 or the contact protrusion 191 of the handle component 10 can engage with the engagement protrusion 950, and which will be described in greater detail in the later paragraphs.

The latch component 30 may be an integrally formed single piece of any suitable plastic, metal, or the combination thereof. In this embodiment, the latch component 30 may include a plate portion 310, a second hook portion 330, and a first contact portion 350. The plate portion 310 may have a groove 311, the fixing components 73 are disposed through and slidably along the groove 311 and fixed to the plate body 810 of the casing assembly 8, such that the plate portion 310 is slidably disposed on the plate body 810 of the casing assembly 8. As shown, the plate portion 310 is slidable in a first sliding direction D2 (as described later with reference to FIG. 4A) or in a second sliding direction D2' (as described later with reference to FIG. 4B) with respect to the plate body 810. The fixing component 73 is, for example, a screw, rivet, bolt, a combination thereof, or other suitable fixing means.

In this embodiment, the second restoring component 40 may be disposed between the plate portion 310 and the plate body 810. In specific, the second restoring component 40 may be an extension spring having two opposite ends respectively fixed to the plate portion 310 and the plate body 810 so as to constantly force the plate portion 310 to slide in the second sliding direction D2'. As shown, the second restoring component 40 can force the plate portion 310 to move towards the pivot portion 110 of the handle component 10.

The second hook portion 330 and the first contact portion 350 are spaced apart from each other and protrude in a direction outwards the pivot portion 110 of the handle component 10 from a side of the handle component 10 close to the plate portion 310. In specific, the second hook portion 330 and the first contact portion 350 both have a tapered structure tapered towards a direction towards the pivot portion 110, and the first pushing portion 170 also has a tapered structure tapered towards a direction towards the pivot portion 110.

In more detail, in this embodiment, the second hook portion 330 may have a first push surface 331 and a second contact surface 333. The first push surface 331 and the second contact surface 333 are respectively located at two opposite sides of the second hook portion 330, the first push surface 331 may be an inclined surface substantially facing towards and corresponding to the first pushing surface 151 of the first hook portion 150 of the handle component 10, and the second contact surface 333 may be a flat surface substantially parallel to the first sliding direction D2 and the second sliding direction D2' of the plate portion 310.

In this embodiment, the first contact portion 350 of the latch component 30 may have a first contacting surface 351, the first contacting surface 351 and the first push surface 331 of the second hook portion 330 are two opposite inclined surfaces located at two opposite sides of the latch component 30.

In this embodiment, the latch component 30 can be slid to a pushed position (as described later with reference to FIG. 5A) in the first sliding direction D2 or slide to a restored position (as shown in FIG. 1 or as described later with reference to FIG. 4C) in the second sliding direction D2' by, for example, the elastic force of the second restoring component 40 and/or the force from the handle component 10. During the movement of the latch component 30, the second hook portion 330 and the first contact portion 350 are moved towards or away from the pivot portion 110 of the handle component 10. During the movement of the handle component 10 from the released position to the engaged position, the first pushing surface 151 of the first hook portion 150 can engage and push the first push surface 331 of the second hook portion 330. As the handle component 10 reaches the engaged position, the first contact surface 153 of the first hook portion 150 is substantially parallel to and corresponding to the second contact surface 333 of the second hook portion 330 of the latch component 30, and which will be described in greater detail in the later paragraphs.

The releasing component 50 may be an integrally formed single piece of any suitable plastic, metal, or the combination thereof. In this embodiment, the releasing component 50 may include a friction portion 510, a pressed portion 530, and a second pushing portion 550. The friction portion 510 is pivotably disposed on the plate body 810 via the fastener 75 fixed to the plate body 810, such that the friction portion 510 is pivotable with respect to the plate body 810 about an axis AX2 either in the first pivotal direction D1 or in the second pivotal direction Dr. The fastener 75 is, for example, a screw, rivet, bolt, a combination thereof, or other suitable fixing means. In this embodiment, the washer 60 may be disposed between the fastener 75 and the friction portion 510, and the friction portion 510 may have a plurality of convex dots 511 protruding outwards from a surface of the friction portion 510 facing away from the plate body 810 and configured to be in contact with the washer 60 so as to increase the normal force between the friction portion 510 and the washer 60. The washer 60 may be made of suitable metal or rubber. As such, the resistance to the movement of the friction portion 510 in the first pivotal direction D1 or the second pivotal direction D1' is increased.

Note that any suitable design that can increase the friction during the rotation of the friction portion all can be applied to the releasing component. For example, in one embodiment, the convex dots may be omitted, and the friction portion may be made of a high friction coefficient material that can make the friction portion achieve the required frictional resistance with the washer.

The pressed portion 530 and the second pushing portion 550 protrude outwards from two opposite sides of the friction portion 510. The pressed portion 530 may have a tapered structure tapered towards the handle component 10, and the second pushing portion 550 may have a tapered structure tapered towards the first contact portion 350 of the latch component 30; in other words, the pressed portion 530 and the second pushing portion 550 are two tapered parts of the releasing component 50 substantially tapered towards opposite directions.

In more detail, in this embodiment, the pressed portion 530 may have a second push surface 531. The second push surface 531 is substantially facing towards the second pushing surface 171 of the first pushing portion 170. The second pushing portion 550 may have a third pushing surface 551, the third pushing surface 551 may be an inclined surface substantially facing towards the first contacting surface 351 of the first contact portion 350.

In this embodiment, the releasing component 50 can be pivoted to a pushing position (as described later with reference to FIG. 5A) in the second pivotal direction D1' or pivoted to an original position (as shown in FIG. 1 or as described later with reference to FIG. 4C) in the first pivotal direction D1 by, for example, the force from the handle component 10 or the latch component 30.

Figure 4A:
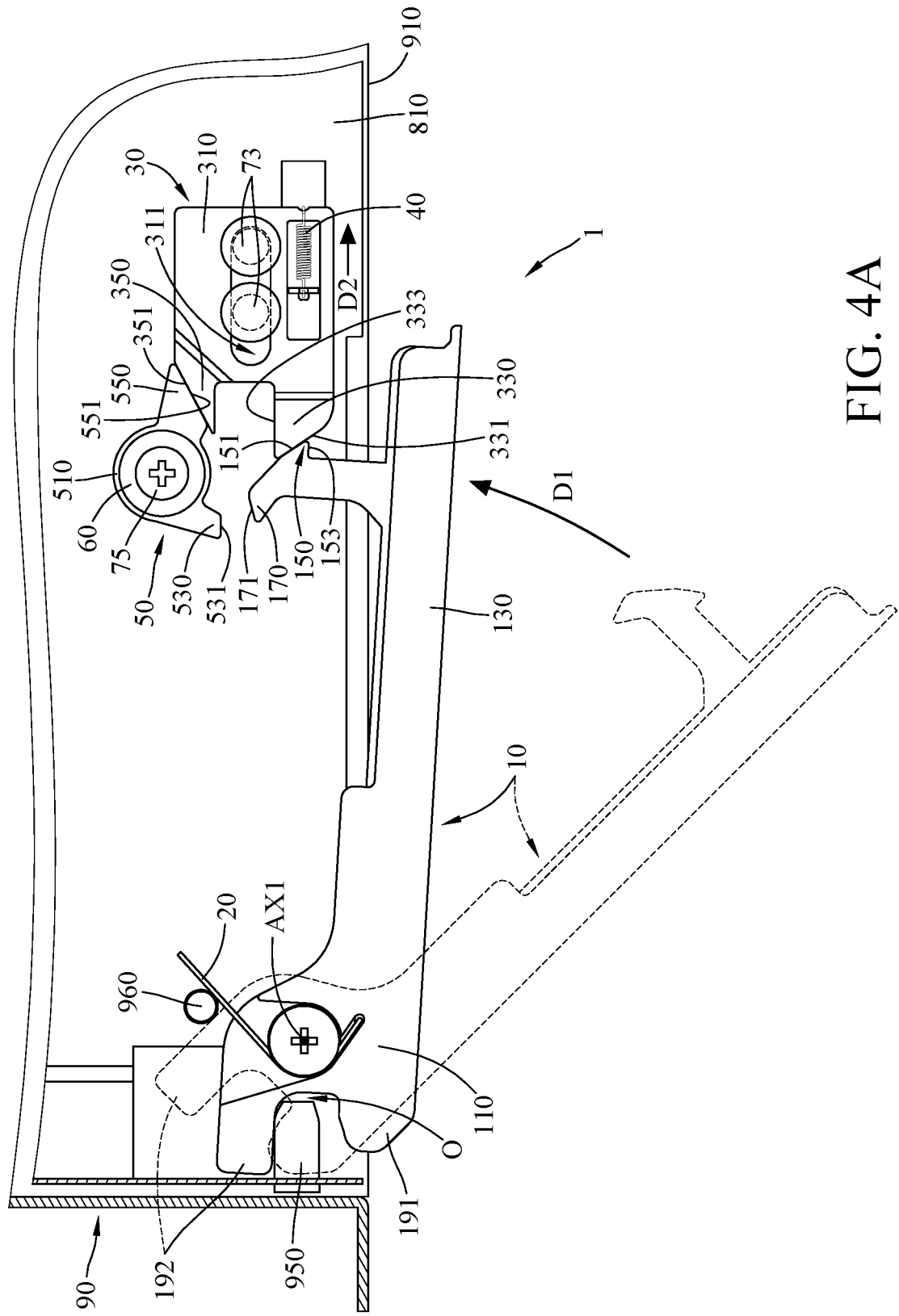
FIGS. 4A-4C illustrates the operation of closing the handle mechanism in FIG. 1.

Then, please refer to FIG. 1 and also refer to FIGS. 4A-4C, closing the handle mechanism 1 will be described hereinafter. Firstly, as shown in FIG. 1 and FIG. 4A, before switching the handle mechanism 1 from the opened status to the closed status, the casing assembly 8 may be partially accommodated in the casing body 90 of the casing 9, and the engagement protrusion 950 of the casing 9 may be placed in the engaging portion O of the handle component 10 of the handle mechanism 1. To close the handle mechanism 1, the handle portion 130 of the handle component 10 can be forced to make the handle component 10 pivot towards the engaged position in the first pivotal direction D1 from the released position. During this process, the first pushing surface 151 of the first hook portion 150 will push and slide along the first push surface 331 of the second hook portion 330 of the latch component 30 so as to force the latch component 30 to move towards the pushed position in the first sliding direction D2. And the handle component 10 being pivoted towards the engaged position can deform the first restoring component 20 and push the latch component 30 to the pushed position and therefore further extent the second restoring component 40, during of which, the first restoring component 20 stores elastic energy sufficient to restore the handle component 10 back to the released position, and the second restoring component 40 stores elastic energy sufficient to restore the latch component 30 back to the restored position.

Meanwhile, during the movement of the handle component 10 to the engaged position, the contact protrusion 192 can engage with the engagement protrusion 950 of the casing 9 so as to move the plate body 810 fixed to the handle component 10 inwards the casing body 90 of the casing 9, thereby forcing the whole plate body 810 to slide to the desired position in the casing body 90. That is, while the handle mechanism 1 is being switched to the closed status, the handle mechanism 1 can bring the plate body 810 further into the casing 9 by using the contact protrusion 192 to push the engagement protrusion 950 of the casing 9.

Figure 4B:
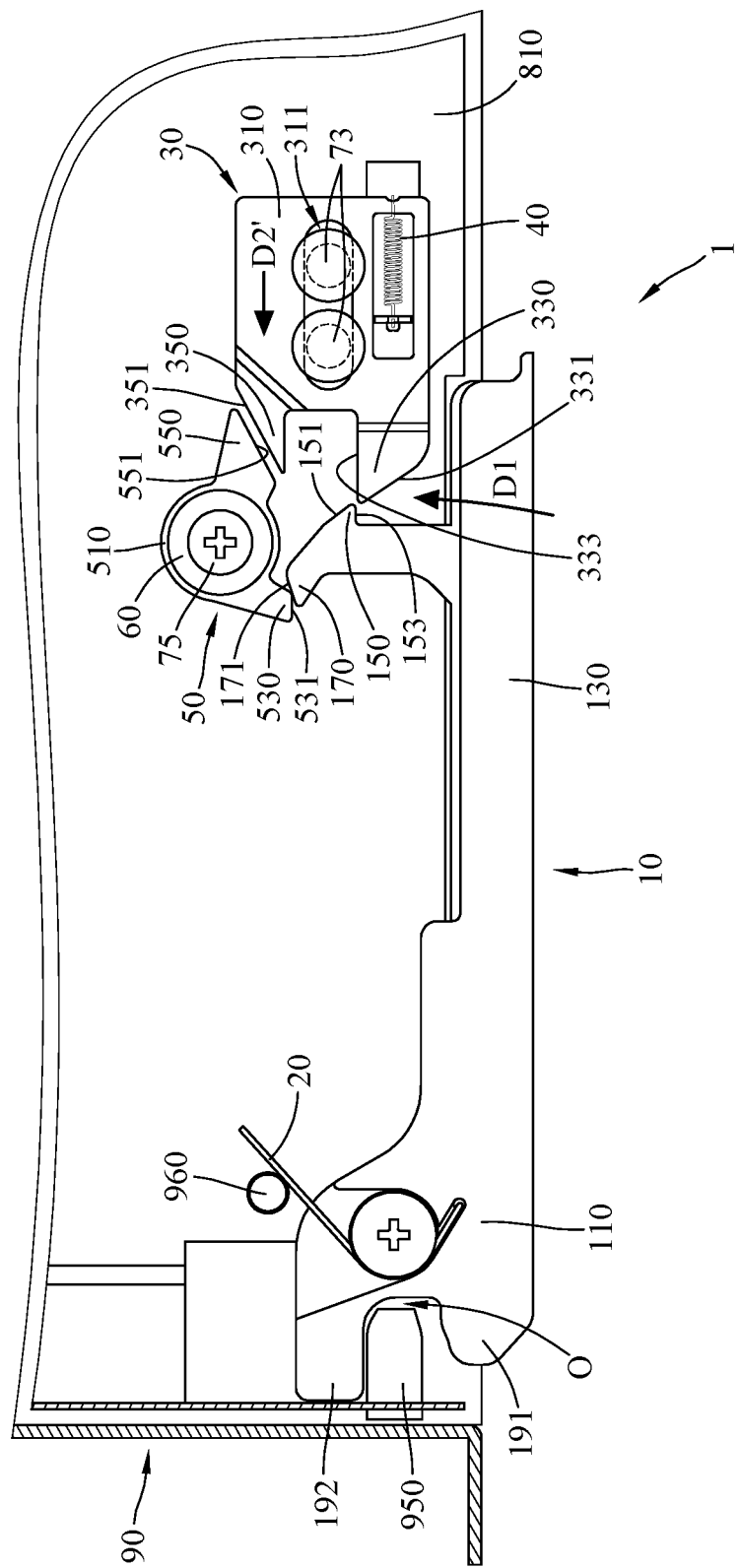
Figure 4C:
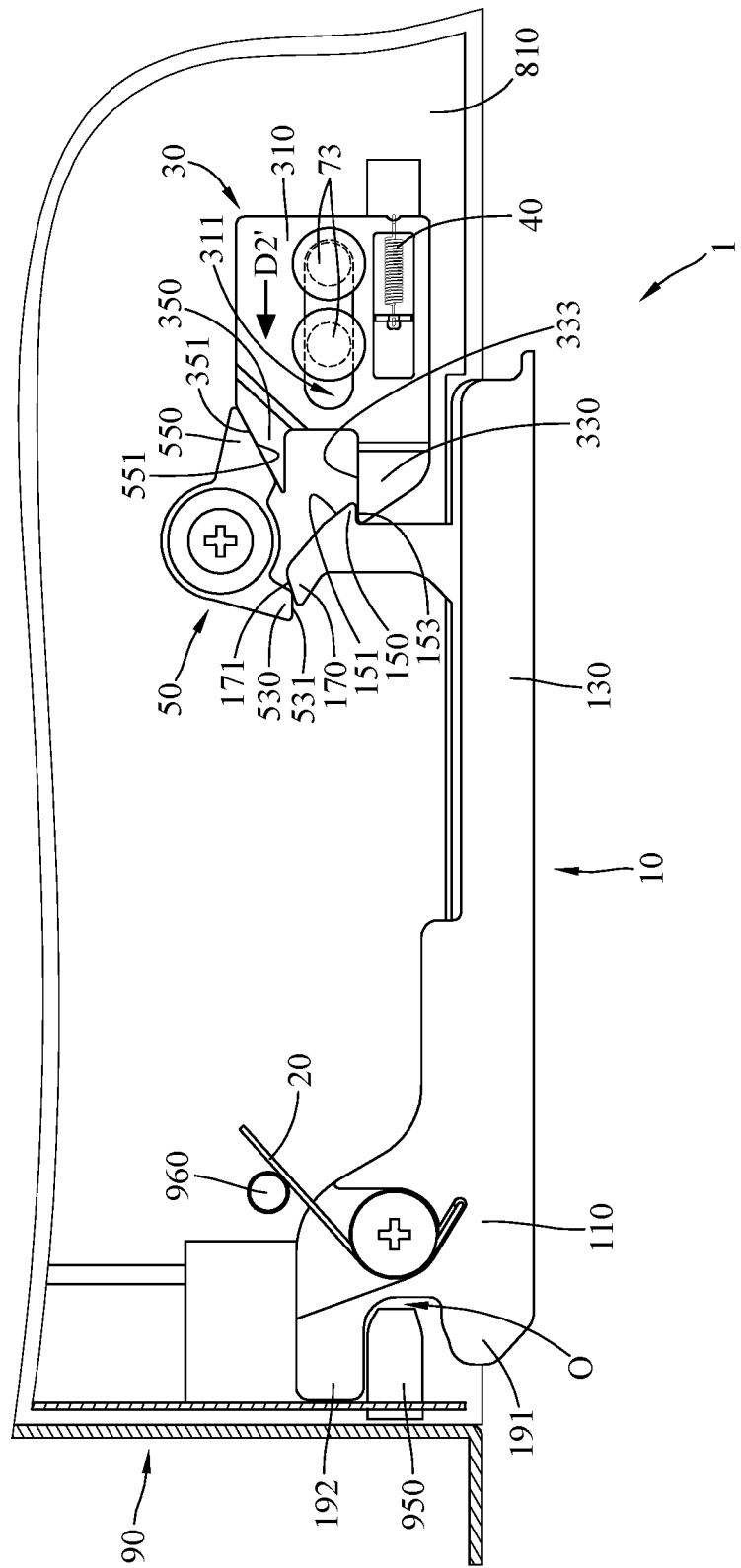

Then, as shown in FIGS. 4B-4C, the first hook portion 150 of the handle component 10 moves to a position that does not contact the first push surface 331 of the latch component 30, the second restoring component 40 at this moment temporarily unable to exhibit its elastic force to the first hook portion 150 of the handle component 10 through the latch component 30, thus, the user can recognize the change on the handle component 10 so that the user will be able to aware that the handle component 10 now reaches the engaged position and it is the timing to release the handle component 10. Meanwhile, since the first hook portion 150 of the handle component 10 does not block the latch component 30, the elastic force stored in the second restoring component 40 will be released to restore the latch component 30 back to the restored position from the pushed position, such that the second contact surface 333 of the second hook portion 330 of the latch component 30 will engage with the first contact surface 153 of the first hook portion 150 of the handle component 10 and thus keeping the handle component 10 in the engaged position.

In this status, the latch component 30 is kept in the restored position by being forced by the second restoring component 40, and the first contact surface 153 of the handle component 10 is kept in contact with the second contact surface 333 of the latch component 30 by being forced by the first restoring component 20, thus the second contact surface 333 can block the first contact surface 153 and keep the handle component 10 in the engaged position, thereby keeping the handle mechanism 1 in the closed status.

In addition, in FIGS. 4B and 4C, the first pushing portion 170 of the handle component 10 may be in contact with the pressed portion 530 of the releasing component 50 or spaced a neglectable gap with the pressed portion 530. In FIG. 4C, the first contacting surface 351 of the first contact portion 350 of the latch component 30 may be in contact with the third pushing surface 551 of the second pushing portion 550 of the releasing component 50 or spaced a neglectable gap with the third pushing surface 551.

Figure 5A:
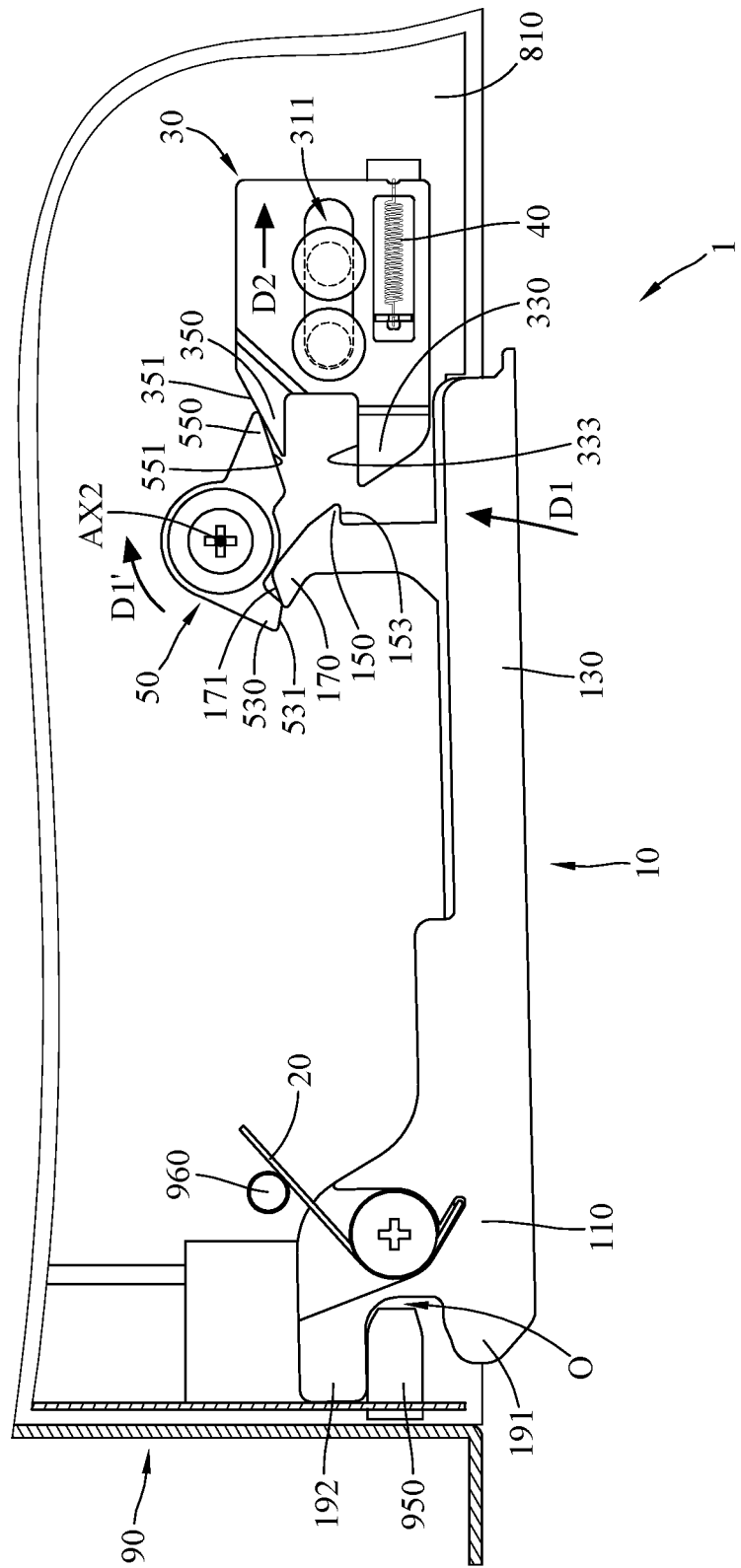
FIGS. 5A-5B illustrates the operation of opening the handle mechanism in FIG. 1.
Figure 5B:
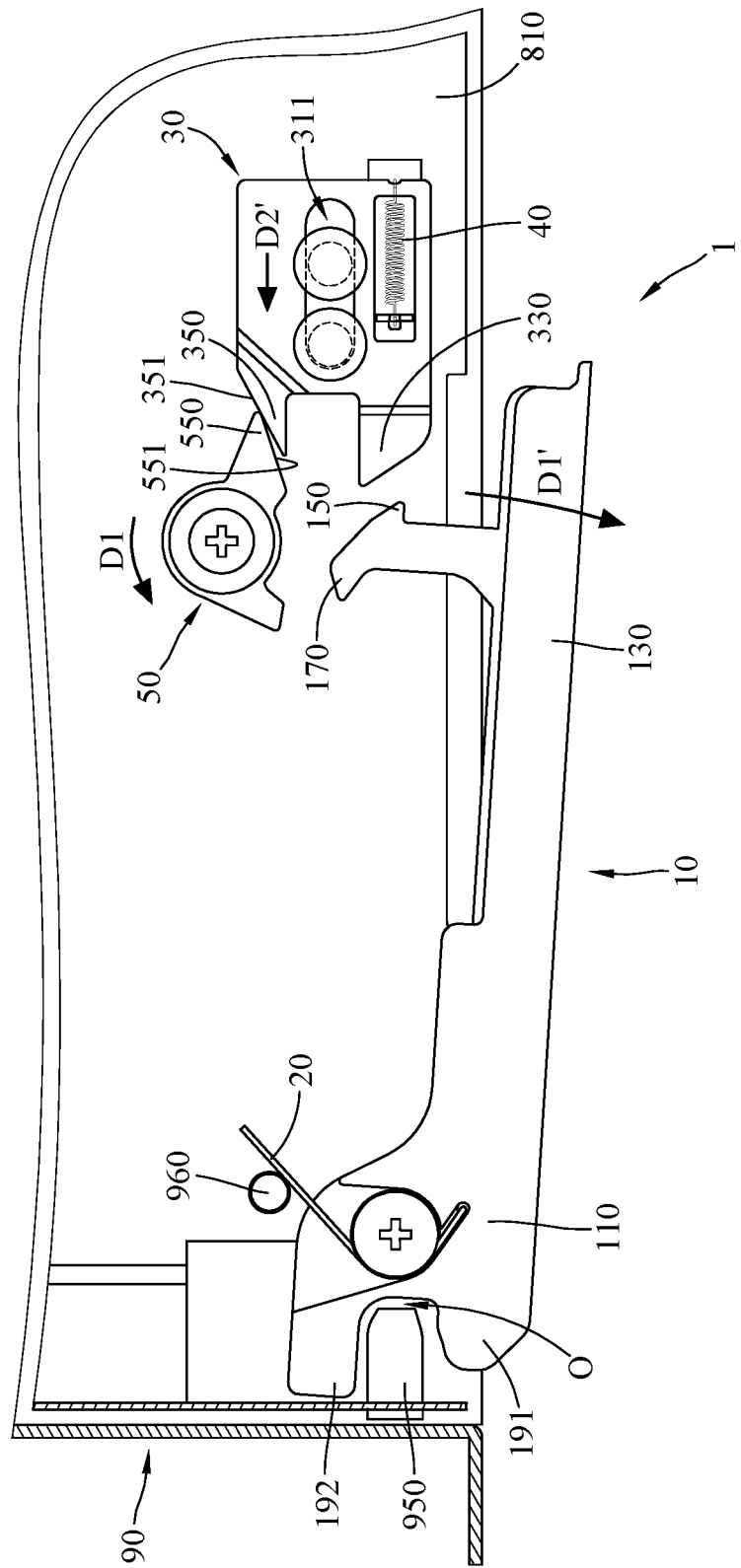

Then, referring to FIGS. 5A-5B, opening the handle mechanism 1 will be described hereinafter. Firstly, in FIG. 5A, there is shown the handle mechanism 1 in the closed status to be opened, the handle portion 130 of the handle component 10 can be forced to make the handle component 10 further pivot in the first pivotal direction D1 so as to cause the second pushing surface 171 of the first pushing portion 170 to push the pressed portion 530 of the releasing component 50. As shown, the second push surface 531 of the pressed portion 530 will be pushed by the second pushing surface 171 of the first pushing portion 170, such that the releasing component 50 is pivoted from the original position towards the pushing position in the second pivotal direction D1'. At this moment, defining the handle component 10 is in a releasing position. The releasing component 50 pivoted towards the pushing position will cause the third pushing surface 551 of the second pushing portion 550 to push the first contacting surface 351 of the first contact portion 350 of the latch component 30 so as to force the latch component 30 to move from the restored position towards the pushed position in the first sliding direction D2. The friction portion 510 of the releasing component 50 can stop the handle component 10 from further pivoting in the first pivotal direction D1 and can stop the handle component 10 at the releasing position, and the user can recognize the change on the handle component 10 so that the user will be able to aware that it is the timing to release the handle component 10. During this process, the first restoring component 20 will store elastic energy sufficient to restore the handle component 10 back to the released position, and the second restoring component 40 stores elastic energy sufficient to restore the latch component 30 back to the restored position.

By doing so, the second contact surface 333 of the second hook portion 330 of the latch component 30 is removed from the first contact surface 153 of the first hook portion 150 of the handle component 10. Without the restriction of the latch component 30, the handle component 10 now can go back to the released position, and the latch component 30 at the same time will be moved back to the restored position by the second restoring component 40. In detail, referring to FIG. 5B, as the handle component 10 is released, the elastic energy stored in the first restoring component 20 will be released to pivot the handle component 10 towards the released position in the second pivotal direction D1'.

Meanwhile, the high friction in moving in the first pivotal direction D1 or the second pivotal direction D1' caused by the friction portion 510 of the releasing component 50 indirectly increases the resistance that the latch component 30 is restored back to the restored position in the second sliding direction D2', thus slowing down the speed that the second restoring component 40 restores the latch component 30. As such, the handle component 10 will have enough time to leave the releasing position and move towards the released position in the second pivotal direction D1' before the second restoring component 40 returning to the restored position. After the handle component 10 leaves the engaged position, the second restoring component 40 can push the latch component 30 back to the restored position along the second sliding direction D2' at a relatively slow speed, and during of which, the second restoring component 40 can force the releasing component 50 to turn back to the original position along the first pivotal direction D1 by forcing the latch component 30.

In one example, the handle component 10 may cost around 0.2-0.4 seconds from the engaged position to the released position, but the latch component 30 may cost around 1.5 seconds from the pushed position to the restored position due to the effect of the releasing component 50, This time difference is sufficient for the handle component 10 to leave the latch component 30 and therefore ensure the opening of the handle mechanism 1.

Also, while the handle component 10 is moving towards the released position, the contact protrusion 191 will contact and push the engagement protrusion 950 of the casing 9 so as to move the plate body 810 fixed to the handle component 10 outwards from the casing body 90 of the casing 9. That is, while the handle mechanism 1 is being switched to the opened status, the handle mechanism 1 can bring the plate body 810 out of the casing 9 by using the contact protrusion 191 to push the engagement protrusion 950 of the casing 9. In addition, as shown, when the handle component 10 is opened at a specific angle to the casing assembly 8, the protrusion 960 will block the contact protrusion 192 so as to prevent the handle component 10 from being moved further in the second pivotal direction D1', that is, the handle component 10 is prevented from being opened too wide.

As discussed, the handle mechanism 1 at least features a handle for drawing the casing assembly 8 and a fixing arrangement for fixing the casing assembly 8 to the casing 9. It only requires one push of the handle component 10 to complete the process of pushing the casing assembly 8 into the casing 9 and fixing the casing assembly 8 to the casing 9, and one more push of the handle component 10 will be able to complete the process of disengaging and drawing the casing assembly 8 from the casing 9. Therefore, the handle mechanism 1 can achieve toolless and labor-saving installation/removal of the casing assembly 8 on the casing 9.

Accordingly, opening/closing the handle mechanism 1 and fixing/releasing the casing assembly 8 all can be done by simply pushing the handle component 10 of the handle mechanism 1, thus the handle component 10 can have a relatively simple appearance compared to the traditional handles that have a release button thereon. As a result, the handle component 10 will be easier to have a consistent appearance with the casing assembly 8 and the casing 9 and can help to achieve a simple-looking appearance of the whole. In addition, in the case of traditional handles that have a release button thereon, the placement of the release button requires the casing for supporting the handle to form holes on the I/O interface, but, in this embodiment, the handle mechanism 1 has no need to form any hole for release button on the I/O interface and therefore will not occupy the layout space on the I/O interface.

Further, in this embodiment, the components of the handle mechanism 1, such as the handle component 10, the latch component 30, and the releasing component 50 are flat-shape objects disposed on the plate body 810 of the casing assembly 8, thus the handle mechanism 1 occupies less internal space of the casing assembly 8 as possible.

In addition, it is understood that the quantity of the handle mechanism 1 in the casing 9 is depending on the quantity of the casing assembly 8 to be accommodated in the casing 9. Moreover, in some embodiments, the handle mechanism may omit the aforementioned releasing component; in such a case, the handle component may push the latch component to the pushed position using its handle component, and, with a proper restoring design, there still will be enough time difference for the handle component to move back to the released position.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. A handle mechanism, adapted to be installed on a plate body being slidable, the handle mechanism comprising: a handle component, configured to be pivotably disposed on the plate body about an axis and having an engaged position, the handle component comprising a first hook portion and a first pushing portion, the first hook portion having a first contact surface; a latch component, configured to be slidably disposed on the plate body and movable towards or away from the axis of the handle component, wherein the latch component comprises a second hook portion and a first contact portion, the second hook portion has a second contact surface configured to directly contact the first contact surface so as to keep the handle component in the engaged position; and a releasing component, configured to be pivotably disposed on the plate body and comprising a pressed portion and a second pushing portion; wherein when the handle component is pivoted in a first pivotal direction from the engaged position, the first pushing portion pushes the pressed portion so as to force the second pushing portion to push the first contact portion so that the second contact surface of the second hook portion is disengaged from the first contact surface of the first hook portion; wherein the handle component is pivotably disposed on the plate body and further has a released position, the first hook portion of the handle component has a first pushing surface opposite to the first contact surface, the second hook portion of the latch component has a first push surface opposite to the second contact surface; when the handle component is pivoted towards the engaged position from the released position along the first pivotal direction, the first pushing surface pushes the first push surface so as to force the latch component to move away from the releasing component.

2. The handle mechanism according to claim 1, wherein when the handle component is pivoted in the first pivotal direction from the engaged position, the first pushing portion forces the releasing component to pivot along a second pivotal direction opposite to the first pivotal direction.

3. The handle mechanism according to claim 2, further comprising a first restoring component and a second restoring component, the first restoring component is disposed on the handle component and configured to force the handle component to pivot in the second pivotal direction, the second restoring component is disposed on the latch component and configured to force the latch component to press against the second pushing portion of the releasing component.

4. The handle mechanism according to claim 1, wherein the releasing component comprises a friction portion, the pressed portion and the second pushing portion respectively are respectively located at two opposite sides of the friction portion and are pivotably disposed on the plate body via the friction portion, and the friction portion is configured for increasing the rotational friction of the releasing component.

5. The handle mechanism according to claim 4, further comprising a washer, wherein the friction portion has a plurality of convex dots, the washer is disposed on the friction portion, the plurality of convex dots press against the washer to increase the rotational friction of the releasing component.

6. The handle mechanism according to claim 1, wherein the plate body is adapted to be slidably disposed on a plate part, the handle component further comprises an engaging portion, a handle portion, and a pivot portion located between and connected to the engaging portion and the handle portion, the pivot portion is adapted to be pivotably disposed on the plate body, the first hook portion is connected to the pivot portion via the handle portion, the engaging portion is configured to be engaged with the plate part.

7. A casing assembly, comprising: a plate body; and a handle mechanism, comprising: a handle component, pivotably disposed on the plate body about an axis and having an engaged position, the handle component comprising a first hook portion and a first pushing portion, the first hook portion having a first contact surface; a latch component, slidably disposed on the plate body and movable towards or away from the axis of the handle component, wherein the latch component comprises a second hook portion and a first contact portion, the second hook portion has a second contact surface configured to directly contact the first contact surface so as to keep the handle component in the engaged position; and a releasing component, pivotably disposed on the plate body and comprising a pressed portion and a second pushing portion; wherein when the handle component is pivoted in a first pivotal direction from the engaged position, the first pushing portion pushes the pressed portion so as to force the second pushing portion to push the first contact portion so that the second contact surface of the second hook portion is disengaged from the first contact surface of the first hook portion; wherein the handle component is pivotably disposed on the plate body and further has a released position, the first hook portion of the handle component has a first pushing surface opposite to the first contact surface, the second hook portion of the latch component has a first push surface opposite to the second contact surface; when the handle component is pivoted towards the engaged position from the released position along the first pivotal direction, the first pushing surface pushes the first push surface so as to force the latch component to move away from the releasing component.

8. The casing assembly according to claim 7, wherein when the handle component is pivoted in the first pivotal direction from the engaged position, the first pushing portion forces the releasing component to pivot along a second pivotal direction opposite to the first pivotal direction.

9. The casing assembly according to claim 8, further comprising a first restoring component and a second restoring component, the first restoring component is disposed on the handle component and configured to force the handle component to pivot in the second pivotal direction, the second restoring component is disposed on the latch component and configured to force the latch component to press against the second pushing portion of the releasing component.

10. The casing assembly according to claim 7, wherein the releasing component comprises a friction portion, the pressed portion and the second pushing portion respectively are respectively located at two opposite sides of the friction portion and are pivotably disposed on the plate body via the friction portion, and the friction portion is configured for increasing the rotational friction of the releasing component.

11. The casing assembly according to claim 10, wherein the handle mechanism further comprises a washer, wherein the friction portion has a plurality of convex dots, the washer is disposed on the friction portion, the plurality of convex dots press against the washer to increase the rotational friction of the releasing component.

12. The casing assembly according to claim 7, wherein the plate body is adapted to be slidably disposed on a plate part, the handle component further comprises an engaging portion, a handle portion, and a pivot portion located between and connected to the engaging portion and the handle portion, the pivot portion is adapted to be pivotably disposed on the plate body, the first hook portion is connected to the pivot portion via the handle portion, the engaging portion is configured to be engaged with the plate part.

* * * * *